(12) United States Patent
Abdolvand et al.

(10) Patent No.: US 8,228,141 B2
(45) Date of Patent: Jul. 24, 2012

(54) Q ENHANCEMENT IN MICROMACHINED LATERAL-EXTENSIONAL RESONATORS

(75) Inventors: Reza Abdolvand, Stillwater, OK (US); Brandon Harrington, Tulsa, OK (US)

(73) Assignee: The Board of Regents for Oklahoma State University, Stillwater, OK (US)

( * ) Notice: Subject to any disclaimer, the term of this patent is extended or adjusted under 35 U.S.C. 154(b) by 341 days.

(21) Appl. No.: 12/626,491

(22) Filed: Nov. 25, 2009

(65) Prior Publication Data

US 2010/0156566 A1 Jun. 24, 2010

Related U.S. Application Data

(60) Provisional application No. 61/118,207, filed on Nov. 26, 2008.

(51) Int. Cl.
*H03H 9/09* (2006.01)
*H03H 9/15* (2006.01)
*H03H 9/24* (2006.01)
*H03H 9/50* (2006.01)

(52) U.S. Cl. ........ 333/186; 333/187; 333/200; 310/335; 257/254; 216/39

(58) Field of Classification Search .......... 333/186–189, 333/197–200; 257/254; 216/39; 310/322, 310/323, 326, 328, 334, 335
See application file for complete search history.

(56) References Cited

U.S. PATENT DOCUMENTS

| | | | |
|---|---|---|---|
| 5,739,944 A * | 4/1998 | Dyott et al. ............... | 359/287 |
| 6,424,237 B1 * | 7/2002 | Ruby et al. ................ | 333/187 |
| 6,534,900 B2 | 3/2003 | Aigner et al. | |
| 6,841,922 B2 | 1/2005 | Aigner et al. | |
| 6,909,221 B2 | 6/2005 | Ayazi et al. | |
| 7,295,088 B2 * | 11/2007 | Nguyen et al. ............. | 333/186 |
| 7,323,952 B2 * | 1/2008 | Pan et al. .................. | 333/186 |
| 7,990,232 B1 * | 8/2011 | Lee .......................... | 333/186 |
| 8,040,207 B2 * | 10/2011 | Winkler et al. ............ | 333/186 |

OTHER PUBLICATIONS

Modh et al.; "Deep-Etched Distributed Bragg Reflector Lasers with Curved Mirrors—Experiments and Modeling"; IEEE Journal of Quantum Electronics, vol. 37, No. 6, Jun. 2001, pp. 752-761.*

Abdolvand et al., "Thin-film piezoelectric-on-silicon resonators for high-frequency reference oscillator applications" Abstract Only, Trans Ultrason Ferroelectr Freq Control, Dec. 2008, pp. 2596-2606, vol. 55, No. 12, Publisher: IEEE.

Abdolvand et al.., "Single-Resonator Dual-Frequency Thin-Film Piezoelectric-on-Substrate Oscillator", 2007, Publisher: IEEE, pp. 419-422.

Abdolvand et al., "A Low-Voltage Temperature-Stable Micromechanical Piezoelectric Oscillator" Abstract Only, Solid-State Sensors, Actuators and Microsystems Conference, Jun. 2007, pp. 53-56.

(Continued)

*Primary Examiner* — Barbara Summons
(74) *Attorney, Agent, or Firm* — Fellers, Snider, Blankenship, Bailey & Tippens, P.C.

(57) ABSTRACT

A high Q resonator device is disclosed. The device includes a substrate, a resonator tethered to the substrate by a tether, and an acoustic reflector etched into the substrate and positioned proximate the tether so as to reflect a substantial portion of planar acoustic energy received from the tether back into the tether.

20 Claims, 6 Drawing Sheets

OTHER PUBLICATIONS

Pourkamali et al., "Low-impedance VHF and UHF capacitive silicon bulk acoustic wave resonators Part 1 Concept and fabrication" Abstract Only, Transactions on Electron Devices, 2007, pp. 2017-2023, vol. 54, No. 8, Publisher: IEEE.

Candler, Rob N. et al., "Investigation of Energy Loss Mechanisms in Micromechanical Resonators", "Solid-State Sensors, Actuators and Microsystems Conf.", 2003, pp. 332-335, Publisher: IEEE Transducers'03.

Dubois, M.A. et al., "Solidly Mounted Resonator Based on Aluminum Nitride Thin Film", "Proceedings IEEE Ultrasonic Symposium", 1998, pp. 909-912, vol. 1, Publisher: IEEE.

Loebl, H.P. et al., "RF Bulk Acoustic Wave Resonators and Filters", "Journal of Electroceramics", 2007, pp. 109-118, vol. 12, Publisher: Kluwer Academic Publishers, Published in: NL.

Pang, Wei et al., "High Q Film Bulk Acoustic Resonator From 2.4 to 51. GHz", "17th IEEE International Conference on Micro Electro Mechanical Systems (MEMS'04)", 2004, pp. 805-808, Publisher: IEEE.

Seabury, C.W. et al., "Thin Film ZnO Based Bulk Acoustic Mode Filter", "Microwave Symposium Digest", 1997, pp. 181-184, vol. 1, Publisher: IEEE MIT-S International.

* cited by examiner

Q ENHANCEMENT IN MICROMACHINED LATERAL-EXTENSIONAL RESONATORS

CROSS REFERENCE TO RELATED APPLICATIONS

This application claims priority to U.S. Provisional Patent Application No. 61/118,207, entitled "Q ENHANCEMENT IN MICROMACHINED LATERAL-EXTENSIONAL RESONATORS," filed Nov. 26, 2008, the contents of which are hereby incorporated by reference.

FIELD OF THE INVENTION

This disclosure relates to micromachined devices in general and, more particularly, to micromachined resonators.

BACKGROUND OF THE INVENTION

Newer mobile devices demand longer battery life, increased functionality, and smaller footprints. As one component utilized to achieve these goals, high-Q micromachined resonators provide an avenue to bring low power multi-modal filters, oscillators, and sensors on-chip. To further increase frequency selectivity (for filters), improve stability, and reduce power consumption in oscillators, the energy loss must be minimized to reach higher Q in resonators. Different sources of loss, including air damping, energy losses through the support, thermo-elastic damping, and internal friction losses must be considered.

Capacitive single crystalline resonators have repeatedly shown to yield very high Q (tens of thousands) as a result of low internal loss of silicon. However, these devices rarely show low motional impedances at high frequencies. In contrast, piezoelectric resonators, tend to show very small motional impedance and not as high of a quality factor.

Solidly mounted thickness-mode thin-film resonators may utilize acoustic reflectors to enhance their Q. For these devices, a Bragg reflector containing alternating high and low acoustic velocity materials is deposited in $\lambda/4$ (e.g., quarter wavelength) thicknesses under the resonant structure. These alternating layers create an acoustic mirror to reflect energy back to the resonate structure. However, due to the nature of the acoustic waves in a lateral extensional mode resonator, this approach is not applicable.

What is needed is a device for addressing the above, and related, issues.

SUMMARY OF THE INVENTION

The invention of the present disclosure disclosed and claimed, in one aspect thereof comprises a high Q resonator device. The device includes a substrate, a resonator tethered to the substrate by a tether, and an acoustic reflector etched into the substrate and positioned proximate the tether so as to reflect a substantial portion of planar acoustic energy received from the tether back into the tether.

In some embodiments, the acoustic reflector is a trench in the substrate substantially shaped as a segment of a circle. The acoustic reflector may further comprise a plurality of etched trenches having a shape substantially of a segment of a circle and having concave sides facing the tether. The trenches may be backfilled with a material having an acoustic impedance substantially different than the silicon substrate. A distance from the reflector to the tether may be about an integer multiple of a half wavelength of a predetermined acoustic energy.

DETAILED DESCRIPTION OF THE PREFERRED EMBODIMENTS

This disclosure describes the addition of acoustic wave reflectors to an extensional-mode resonator in order to reduce energy loss. In an extensional-mode resonator one method for loss is through its supports. As the resonator vibrates, it creates acoustic waves that travel down its tethers and out of the device. It will be appreciated that the present disclosure discusses structures and methods to redirect some normally lost acoustic energy back into the device. The air/device or vacuum/device interface in the presently disclosed reflectors acoustically isolates the resonant structure from the rest of the substrate. In one embodiment, the resonator is fabricated using microfabrication technology. The resulting resonators can be used as one-port or two-port devices in signal filters or in oscillator circuits. In such designs it may be beneficial to have a high quality factor (Q) resonator. The acoustic wave reflectors increase Q by returning normally lost energy back into the resonator.

Figure 1:
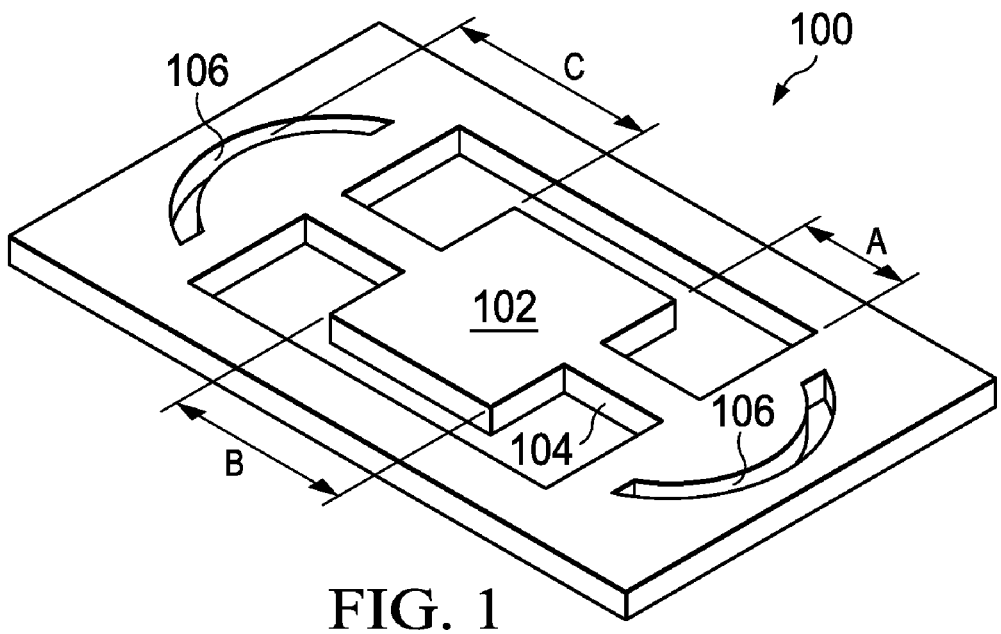
FIG. 1 is a schematic view of a lateral resonator with reflectors according to aspects of the present disclosure.

Referring now to FIG. 1, a lateral mode resonator is shown. A portion of a silicon substrate 100 is provided, upon which micro-electrical devices, micro-electro-mechanical devices, and/or other devices may also be formed. It is understood that the silicon substrate 100 is only exemplary and that the methods and structures of the present disclosure may be utilized with other substrates such as quartz, silicon carbide, nano-crystalline diamond, and other substances. An extensional mode resonator 102 with support tethers 104 is provided on the substrate 101. Acoustic reflectors 106 are provided proximate the supports 104. The length of the supports is denoted 'A', while the resonator length is shown as 'B', and the distance to the reflector 106 from the resonator 102 is denoted 'C'.

Figure 2:
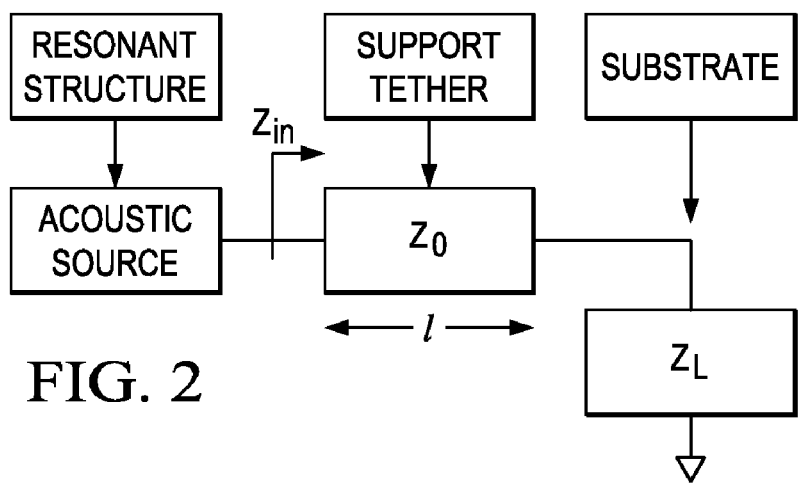
FIG. 2 shows the acoustic equivalent of a support loss mechanism.
Figure 10:
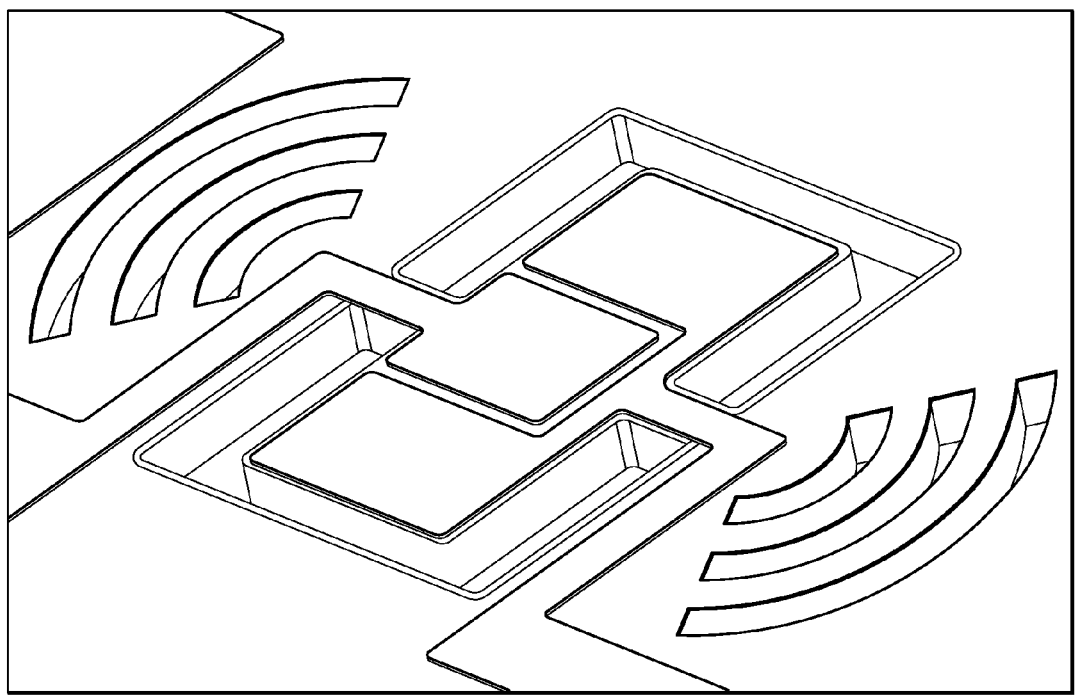
FIG. 10 shows a SEM of resonator with acoustic wave reflectors.

The location and the shape of the reflectors 106 must be considered in order to have the maximum effect. The acoustic wave reflector 106 may be constructed by etching properly shaped trenches around the tethers 104 that support the resonator 102. The trench creates a large abrupt contrast in acoustic velocity. At this transition, an impinging wave will be reflected back to the device. The result of this is a resonator with a higher quality factor (Q) than a resonator without the reflector. While not necessarily to scale, FIGS. 2 and 10 show different embodiments of a circular reflector design on a lateral extensional-mode resonator. It can be seen that the two embodiments are similar, but FIG. 10 shows multiple trenches acting as a reflector.

In some embodiments, rather than open trenches, the trenches may be filled with a material having a substantially different acoustic impedance than the substrate 100 in order to tune the performance of the reflectors. The performance of the reflectors may also be tuned by adjusting the shape of the trenches. Semi-circular trenches are shown as examples in the present disclosure, but other shapes, including complex shapes, are also contemplated. The resonators of the present disclosure may also be actuated by a number of different means. These include, but are not limited to, mechanical devices, piezoelectric devices, thermal devices, and capacitive electrodes.

Utilizing the methods of the present disclosure, unloaded Q values in the range of 14 to 15 thousand are measured in air from third-order AlN-on-silicon resonators at ~115 MHz. This represents a 50% improvement over the highest Q measured from the same devices without a reflector. Thin-film piezoelectric-on-substrate (TPoS) resonators promise low motional impedances with relatively high Q since they can be made on a thick low-loss substrate material. In lateral-mode TPoS resonators photolithographic parameters determine the operating frequency and, therefore, many frequencies can be realized on one substrate.

In lateral-mode resonators such as TPoS resonators, waves propagate in the substrate plane, and the small tethers 104 suspend the resonator 102. Through narrowing the width of the tethers 104 and strategically positioning them on nodal points of the resonance mode, the acoustic energy radiation can be minimized. However, as the resonance frequency increases, the ratio between the tether width and the frequency-defining dimension (e.g. device width in width-extensional resonators) increases quickly. This occurs because the lithographic resolution imposes a lower bound on the tether width. Also, excessively narrowed tethers 104 manipulate the resonator's electrical characteristic in cases where the signal lines run through the tethers. Therefore, the acoustic energy radiation through the tethers (support loss) can dominate at higher frequencies requiring focus on this loss.

As stated, this disclosure describes the implementation of reflectors 106 which acoustically isolate the lateral-mode resonator 102 from the rest of the substrate and minimize the support loss. To obtain isolation, the etched reflector trenches 106 create an air/silicon interface that is seen as near zero acoustic impedance from the resonator edge. The results measured from fabricated resonators prove the effectiveness of these acoustic reflectors.

The support-loss in an acoustic resonator can be modeled by an equivalent transmission-line circuit with the support tethers represented as an acoustic transmission line and the substrate as an acoustic load impedance. In this scenario, a minimum amount of energy should be dissipated in the load, and the transmitted energy should return to the source in phase. FIG. 2 illustrates this concept.

In general, the acoustic impedance is defined as the pressure ($\rho$) divided by the multiplication of particle velocity (v) and surface area.

$$Z = \frac{\rho}{vS}$$

When addressing acoustic impedance, the two extremes, zero acoustic impedance and infinite acoustic impedance, should be observed. For the impedance to be near zero, the acoustic wave-front would hit a boundary of low density material. For the acoustic impedance to be infinite there must be an extremely dense mass that prevents the acoustic wave to travel with any substantial acoustic velocity. This case can be seen as a fixed boundary. For an acoustic wave traveling in silicon, a boundary with vacuum or even air can be seen as zero or near zero impedance. On the other hand near infinite impedance cannot be directly realized. It will be appreciated that, in one embodiment, the present disclosure describes etching a trench into the substrate to create a near-zero acoustic impedance at a fixed distance away from the device. The trench reflects acoustic energy back towards the device.

In order to minimize energy dissipation in the substrate, the support length (acoustic transmission line) can be theoretically optimized to generate an equivalent zero impedance on the edge of the resonator. However, to fulfill this goal, the acoustic load impedance must be known. Previous studies have attempted to use quarter wavelength supports with the assumption that the load impedance is infinite (fixed boundary). This technique has shown little success to yield high Q for the obvious reason of false boundary assumption. In reality, the load impedance is not infinite and the geometrical and physical properties of the substrate can greatly affect it. For example, process variability, such as unpredictable size of the release cavity under the resonator, can alter the characteristics of the support-to-substrate connection causing the acoustic load impedance to change and hindering the ability to match the acoustic transmission line (e.g. support) to the substrate's acoustic impedance.

Assuming that the release cavity is extended to the outer edge of the reflector trench, the acoustic impedance of the load can be regarded the same as the characteristic acoustic impedance of the substrate ($Z_0$). The acoustic impedance seen by the device can then be described as:

$$Z_{in} = jZ_0 \tan(\beta l)$$

where $\beta$ is the wave number, $2\pi$ divided by acoustic wavelength, $\lambda$, and l is the combined length of the support and the distance of the reflector to support edge (see FIG. 2). Therefore, to minimize acoustic impedance seen by the device, and reduce the amount of energy dissipated to the substrate, a distance, l of $\lambda/2$ should be used.

Figure 3A:
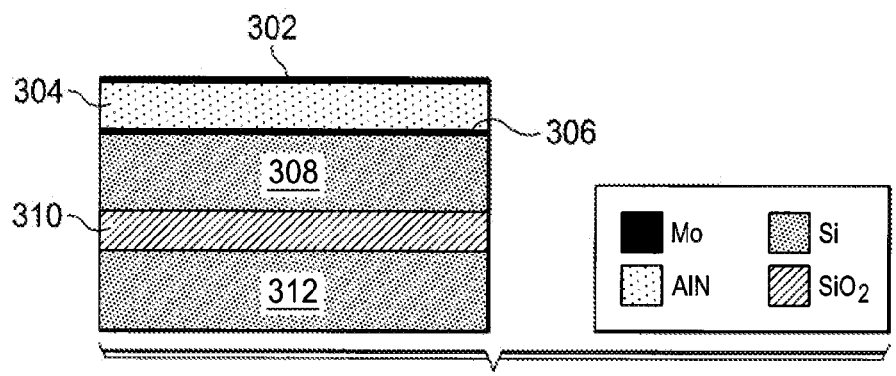
FIGS. 3A-3D illustrate one example of a process flow for producing resonators according to aspects of the present disclosure.
Figure 3B:
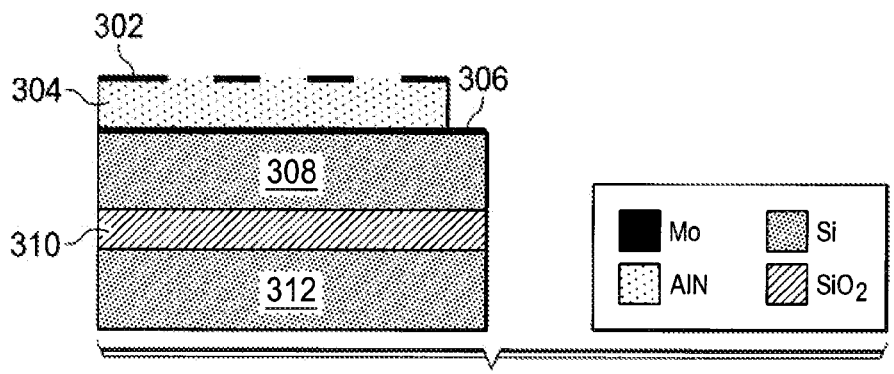
Figure 3C:
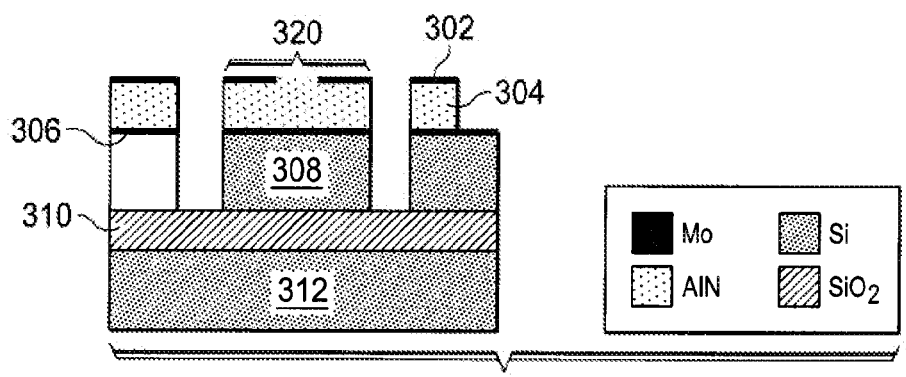
Figure 3D:
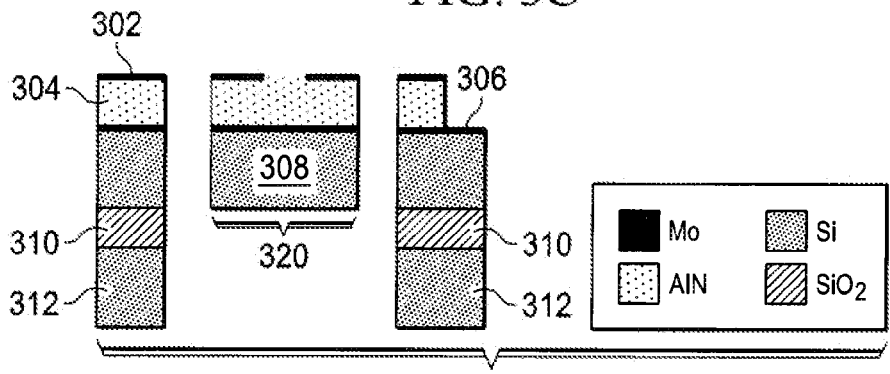

Referring now to FIGS. 3A-3D, one example of a process flow for producing resonators as described in the present disclosure is shown. ALN-on-silicon resonators serve as a platform to study the effect of the device geometry and the acoustic reflectors on their Q. Third-order block resonators at ~115 MHz were fabricated on three different SOI wafer thicknesses (5, 10, and 20 μm) with a stack of molybdenum (Mo) 302, aluminum nitride (ALN) 304 (a piezoelectric), and Mo 306 sputtered on top (FIG. 3A). The top Mo 302 is dry etched to form the top electrodes and traces. The ALN 304 is wet etched to clear access to the bottom electrode (FIG. 3B). The resonator body 320 (e.g., resonator 102 of FIG. 1) is defined (FIG. 3C) with a dry etch of the ALN 304 followed by a deep silicon trench etch through the device layer silicon 308. Following this, the backside handle layer silicon 312 is etched with another deep silicon trench etch. This step creates the cavity below the resonator. The final step (FIG. 3D) is a wet etch to remove the buried oxide layer 310 and release the structure 320.

Figure 4:
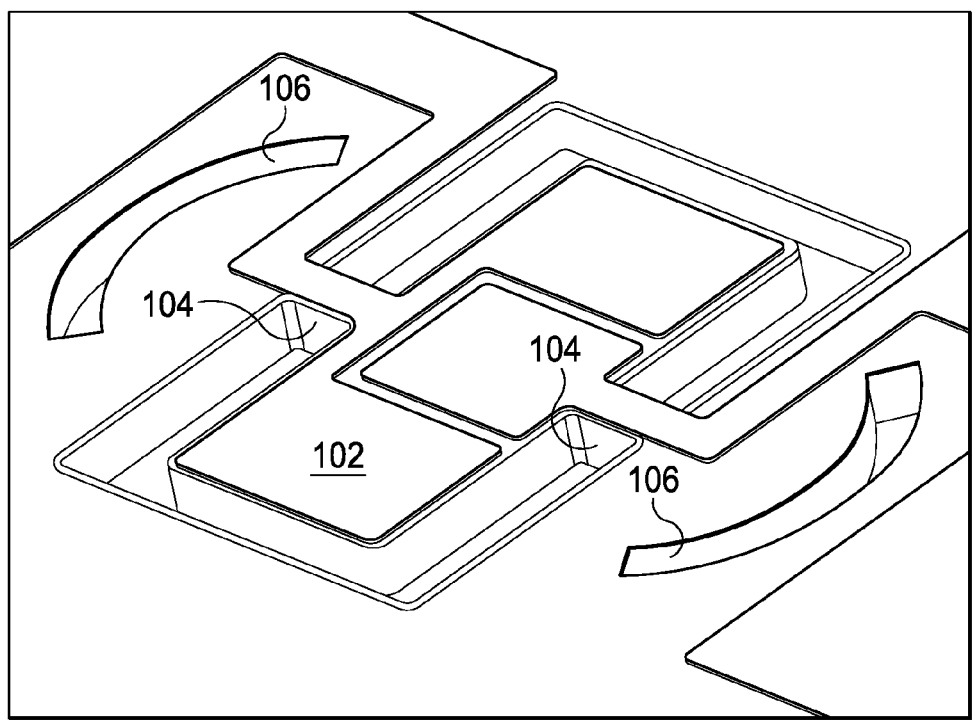
FIG. 4 is an SEM of a fabricated ALN-on-Silicon resonator with acoustic wave reflectors.

Acoustic reflectors are etched during the same etching step in which the resonator structure is defined, and therefore, the process flow is unchanged. A SEM of a final device is seen in FIG. 4. The top electrodes in these devices are patterned in a two-port inter-digitated configuration to enable excitation of the third-order resonance mode.

Figure 5:
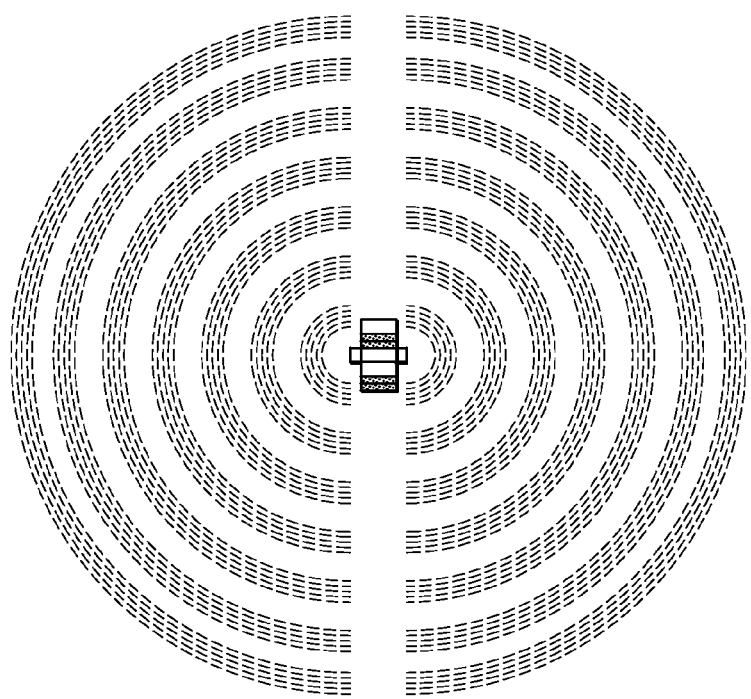
FIG. 5 is a simulation of acoustic waves outside a resonator showing circular propagation from support tethers.

Acoustic wave propagation simulation using a two dimensional representation of the structure provided insight into the shape of the wavefront leaving the support is shown in FIG. 5. The simulation was created using acoustic module of COMSOL finite element analysis package. The structure is excited with an acoustic wave at the two ends of the resonator. The frequency of the wave matches the lateral third-harmonic mode of the resonant structure and the silicon properties are use for this simulation. As seen, circular wavefront is formed at the supports and radiates to the absorptive boundary surrounding the structure. The shape of the reflector in this example was matched to this shape to create a uniform reflection of the energy back towards the resonant structure.

The third-order device shown in FIG. 4 was the embodiment of a resonator designed and tested for measurement. The dimensions of the resonator, 108 µm wide by 54 µm long and the width of the support tether are kept constant throughout the study and the only parameters changed are the length of the support tether and the distance of the reflector from the support edge.

Our test setup included an Agilent network analyzer and a SUSS high frequency probe station with GSG probes. The vacuum measurements were carried in a Janis cryogenic probe station using high frequency probes.

Figure 6:
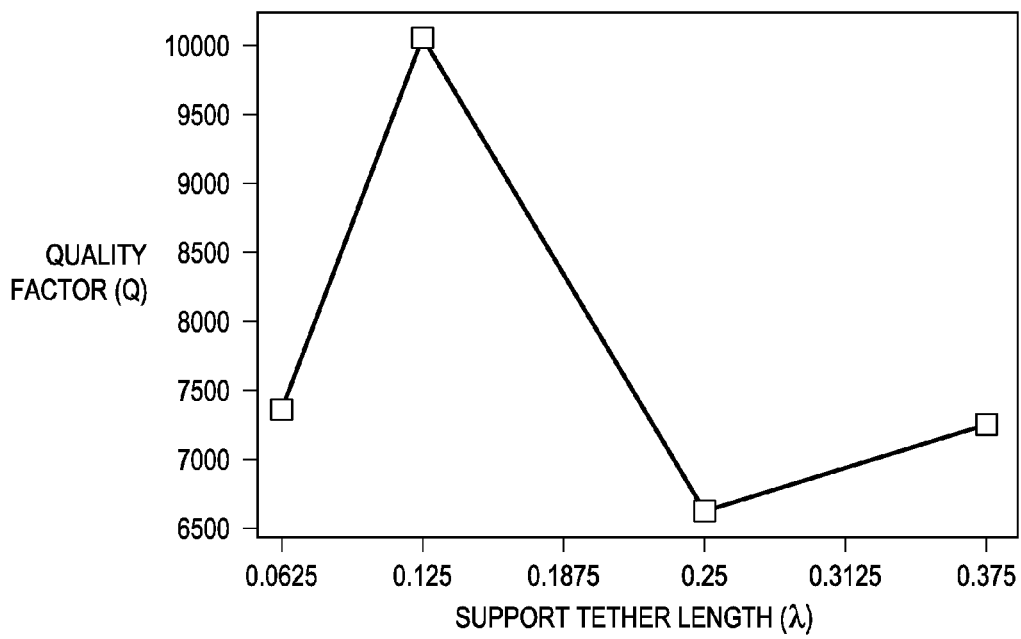
FIG. 6 is a graph showing that the highest Q and support tether length are greatly correlated for resonators fabricated on 20 µm SOI.

Our measurements on devices without reflectors show that the highest Q is recorded for support tether lengths of $\lambda/8$ while $\lambda/4$ lengths exhibit lower values. In an ideal case where the acoustic impedance of the substrate is assumed infinite, $\lambda/4$ is expected to be the highest. However, as explained in previous sections this assumption is not valid and the maximum may no longer occurs at $\lambda/4$. FIG. 6 is a graph showing that the highest Q and support tether length are greatly correlated for resonators fabricated on 20 µm SOI.

Figure 7:
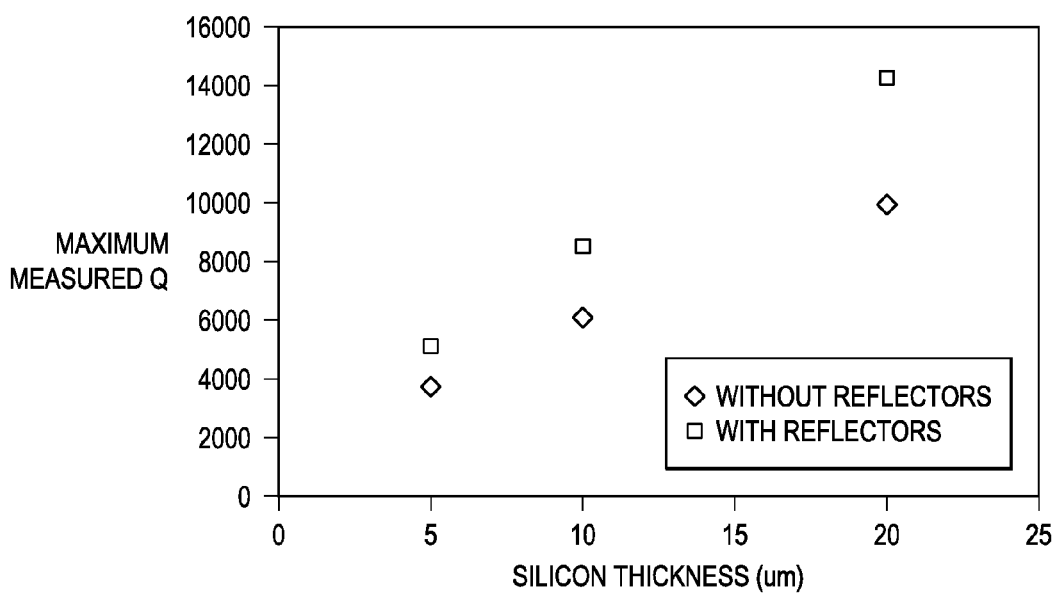
FIG. 7 is a plot showing the maximum measured Q for devices with and without acoustic reflectors fabricated on 3 different SOI wafers.

Across the three thicknesses (5, 10, and 20 µm) a clear distinction can be made. As illustrated in FIG. 7, Q increases as the silicon device layer becomes thicker, allowing the silicon device layer physical parameters to dominate over the ALN.

Our results showed that the maximum quality factor measured from the devices with reflectors is consistently higher than those measured for devices without reflectors. Devices with reflectors measure highest Q when the distance from the device tether 104 to the reflector 106 is near a multiple of $\lambda/2$ (see Table 1), an approximately an integer multiple of about half a wavelength. Alternatively, the lowest Q for devices with reflectors is at distances $\lambda/4+n\lambda/2$. These statements follow equation (2) closely. The impedance the device sees is closest to zero at $\lambda/2$ and infinite at $3\lambda/4$.

Figure 8:
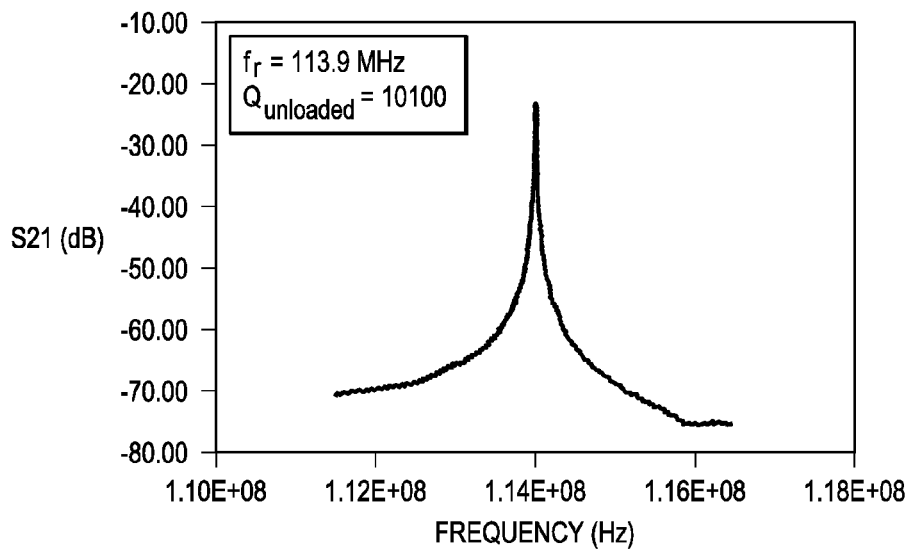
FIG. 8 is a graph showing maximum measured Q from resonators without (support length $\lambda/8$) and with reflectors (support length $\lambda/4$) on 20 µm SOI substrate.
Figure 8:
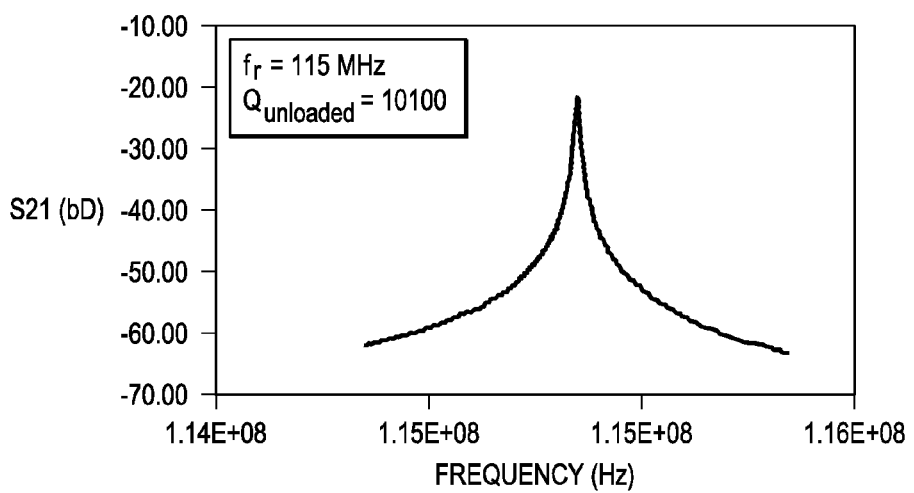
Figure 9:
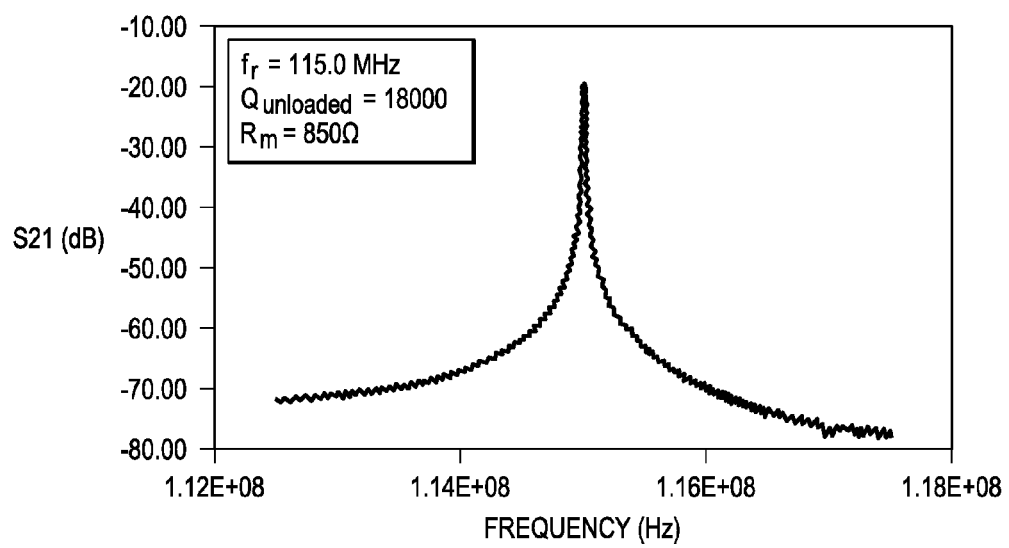
FIG. 9 is a graph of the highest measured Q for a resonator with reflectors on 20 µm SOI under vacuum.

As illustrated in FIG. 8, on the 20 µm SOI, the highest measured unloaded Q (in air) for devices without reflectors is 10100@113.9 MHz. As illustrated in FIG. 9, a device with acoustic reflectors positioned at $\lambda/2$ exhibits the highest unloaded Q of 14400 in air and 18000 in vacuum (FIG. 9).

TABLE 1

| Reflector Distance | Max Measured Q |
| --- | --- |
| $\lambda/2$ | 14400 |
| $3\lambda/4$ | 9300 |
| $\lambda$ | 11200 |

In conclusion, acoustic reflectors were implemented in lateral-mode thin-film piezoelectric-on-substrate resonators to reduce the amount of energy lost through the supports. By combining the effect of the support tether and the acoustic reflectors, a near zero acoustic impedance was created on the edge of the resonator minimizing the support loss. Measured results proved the effectiveness of this technique in improving the quality factor of the resonators. The highest recorded Q of 18,000 in vacuum was measured from a device with reflector at ~115 MHz upwards of 45% improvement over the highest Q measured from devices without reflector.

* * * *

Thus, the present invention is well adapted to carry out the objectives and attain the ends and advantages mentioned above as well as those inherent therein. While presently preferred embodiments have been described for purposes of this disclosure, numerous changes and modifications will be apparent to those of ordinary skill in the art. Such changes and modifications are encompassed within the spirit of this invention as defined by the claims.

What is claimed is:

1. A high Q resonator device comprising:
a substrate;
a resonator tethered to the substrate by a tether; and
an acoustic reflector etched into the substrate and positioned proximate the tether so as to reflect a substantial portion of planar acoustic energy received from the tether back into the tether.

2. The device of claim 1, wherein the acoustic reflector is a trench in the substrate substantially shaped as a segment of a circle.

3. The device of claim 1, wherein the acoustic reflector further comprises a plurality of etched trenches having a shape substantially of a segment of a circle and having concave sides facing the tether.

4. The device of claim 3, wherein the trenches are backfilled with a material having an acoustic impedance substantially different than the substrate formed of silicon.

5. The device of claim 1, wherein a distance from the reflector to the tether is about an integer multiple of a half wavelength of a predetermined acoustic energy.

6. A resonator device comprising:
a resonator;
a plurality of tethers connecting the resonator to a substrate; and
a plurality of acoustic reflectors, each positioned in the substrate proximate the tethers so as to reflect planar acoustic energy of at least one predetermined wavelength received from one or more of the tethers back to the one or more tethers.

7. The device of claim 6, wherein a distance from each of the plurality of tethers to the associated reflector is about an integer multiple of a half wavelength of the planar acoustic energy of the at least one predetermined wavelength.

8. The device of claim 6, wherein each of the plurality of reflectors comprises a trench in the substrate.

9. The device of claim 6, wherein each of the plurality of reflectors is a trench in the substrate having the shape of a segment of a circle.

10. The device of claim 6, wherein each of the plurality of reflectors comprises a plurality of trenches in the substrate, each of the plurality of trenches having the shape of a segment of a circle.

11. The device of claim 6, wherein the resonator, tethers, and substrate comprise silicon.

12. The device of claim 6, wherein the resonator, tethers, and substrate comprise quartz.

13. The device of claim 6, wherein the resonator, tethers, and substrate comprise silicon carbide.

14. The device of claim 6, wherein the resonator, tethers, and substrate comprise nano-crystalline diamond.

15. The device of claim 6, wherein the resonator comprises a layer of silicon, at least partially covered by a first metal layer, at least partially covered by a piezoelectric layer, at least partially covered by a second metal layer.

16. A method of improving Q in a resonator, comprising:
providing a lateral-mode resonator tethered to a silicon substrate by a plurality of tethers;
determining a wavelength $\lambda$ of an acoustic energy; and
placing a planar acoustic reflector proximate each of the plurality of tethers a distance that is about an integer multiple of $\lambda/2$ away from the tether.

17. The method of claim 16, wherein placing an acoustic reflector further comprises etching a trench in the silicon substrate.

18. The method of claim 17, further comprising backfilling the trench with a material of a predetermined acoustic impedance.

19. The method of claim 16, wherein placing an acoustic reflector further comprises etching a trench in the silicon substrate having a shape that is substantially at least a segment of a circle.

20. The method of claim 16, wherein the acoustic reflectors are placed in the same process as providing the lateral-mode resonator.

* * * * *